(12) United States Patent
McMiller et al.

(10) Patent No.: US 6,194,653 B1
(45) Date of Patent: *Feb. 27, 2001

(54) ENCLOSURE DESIGN HAVING AN INTEGRATED SYSTEM OF RETENTION, ELECTROMAGNETIC INTERFERENCE CONTAINMENT AND STRUCTURAL LOAD DISTRIBUTION

(75) Inventors: Daniel F. McMiller, Cardiff By The Sea; Scott Fitzgerald, Encinitas; Alan M. Signorelli, La Costa, all of CA (US)

(73) Assignee: General Instrument Corporation, Horsham, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,293

(22) Filed: Mar. 24, 1998

(51) Int. Cl.[7] .................................................. H05K 9/00
(52) U.S. Cl. ................................. 174/35 GC; 174/35 R; 361/752; 361/816
(58) Field of Search ........................... 174/35 R, 35 GC; 361/816, 818, 800, 753, 799, 752

(56) References Cited

U.S. PATENT DOCUMENTS

| | | | |
|---|---|---|---|
| 4,952,752 | * 8/1990 | Roun | 174/35 R |
| 5,162,610 | * 11/1992 | Clifton et al. | 174/35 R |
| 5,278,351 | * 1/1994 | Herrick | 174/35 R |
| 5,354,951 | * 10/1994 | Lange, Sr. et al. | 174/35 R |
| 5,777,854 | * 7/1998 | Welch et al. | 361/800 |

OTHER PUBLICATIONS

Product Brochure for Chomerics, Inc. "EMI Shielding For Commercial Electronics"(1995) 39 pages.

* cited by examiner

Primary Examiner—Kristine Kincaid
Assistant Examiner—Hung V Ngo
(74) Attorney, Agent, or Firm—Charles J. Kulas; Townsend and Townsend and Crew, LLP

(57) ABSTRACT

A metal enclosure formed of three basic parts of stamped sheet metal. The parts include a system of retention clips, spring fingers and embossed dimples to achieve easy assembly and a high level of electromagnetic interference containment when the parts are assembled. The design also provides high structural rigidity, mechanical strength and ease of assembly/disassembly.

8 Claims, 10 Drawing Sheets

| Frequency (MHz) | Spectrum Analyzer Reading at 3m (dBµV) | Antenna Polori-zation (vertical or horizontal) | Amp. Gain & Cable Loss, Distance & Antenna Factor Correction for 3 m (dBµV/m) | Total Interference Level at 3 m (dBµV/m) | Emission Spec. Limit at 3 m (dBµV/m) | Difference Margin at 3 m (dBµV) |
|---|---|---|---|---|---|---|
| 81,000 | 20.2 | v | 8.4 | 28.6 | 40.0 | -11.4 |
| 175,500 | 11.7 | v | 19.0 | 30.7 | 43.5 | -12.8 |
| 188,995 | 18.5 | v | 19.7 | 38.2 | 43.5 | -5.3 |
| 202,500 | 12.5 | v | 16.1 | 28.6 | 43.5 | -14.9 |
| 229,490 | 12.0 | v | 15.7 | 27.7 | 46.0 | -18.4 |
| 242,990 | 12.4 | h | 16.2 | 28.6 | 46.0 | -17.4 |
| 269,991 | 15.6 | h | 18.2 | 33.8 | 46.0 | -12.3 |
| 269,991 | 16.5 | v | 18.2 | 34.7 | 46.0 | -11.4 |
| 323,986 | 20.5 | h | 20.0 | 40.5 | 46.0 | -5.5 |
| 377,991 | 15.3 | v | 20.7 | 36.0 | 46.0 | -10.0 |
| 404,990 | 14.2 | v | 21.5 | 35.7 | 46.0 | -10.3 |
| 431,990 | 13.5 | v | 22.2 | 35.7 | 46.0 | -10.3 |
| 458,990 | 18.0 | v | 23.1 | 41.1 | 46.0 | -4.9 |
| 819,440 | 5.6 | h | 30.9 | 36.5 | 46.0 | -9.5 |

*FIG. 7A.*

| Frequency (MHz) | Spectrum Analyzer Reading at 3m (dBμV) | Antenna Polori-zation (vertical or horizontal) | Amp. Gain & Cable Loss, Distance & Antenna Factor Correction for 3 m (dBμV/m) | Total Interference Level at 3 m (dBμV/m) | Emission Spec. Limit at 3 m (dBμV/m) | Difference Margin at 3 m (dBμV) |
|---|---|---|---|---|---|---|
| 54,000 | 13.5 | v | 15.7 | 29.2 | 40.0 | -10.8 |
| 81,000 | 15.6 | v | 10.7 | 26.3 | 40.0 | -13.7 |
| 135,000 | 12.9 | v | 15.7 | 28.6 | 43.5 | -14.9 |
| 270,000 | 14.8 | h | 19.9 | 34.7 | 46.0 | -11.3 |
| 324,000 | 15.5 | v | 21.9 | 37.4 | 46.0 | -8.6 |
| 405,000 | 10.3 | v | 23.6 | 33.9 | 46.0 | -12.1 |
| 486,000 | 5.6 | v | 26.4 | 32.0 | 46.0 | -14.0 |
| 540,000 | 5.3 | v | 27.4 | 32.7 | 46.0 | -13.3 |
| 756,000 | 2.3 | v | 32.1 | 34.4 | 46.0 | -11.7 |

*FIG. 8A.*

ENCLOSURE DESIGN HAVING AN INTEGRATED SYSTEM OF RETENTION, ELECTROMAGNETIC INTERFERENCE CONTAINMENT AND STRUCTURAL LOAD DISTRIBUTION

BACKGROUND OF THE INVENTION

This invention relates generally to device enclosures and specifically to a device enclosure having integrated structures providing retention, electromagnetic interference (EMI) containment and structural load distribution.

Electronic devices have grown increasingly complex. Today's devices often use computer processors operating at very fast clock cycles. Devices may process analog or digital signals that are at high frequencies, such as television, video, or other signals. In such applications, the electronics used are sensitive to, or emit, EMI. Such devices can be interfered with, or can interfere with other devices, when multiple devices are placed in proximity with each other. For example, a satellite television receiver, such as an integrated receiver decoder (IRD), or, more generically, a "set-top box," processes and emits high frequencies and can interfere with, and be affected by, devices such as cellular telephones, home computers, etc. Also, EMI can be caused by ambient electrical signals such as broadcast signals. As the home becomes populated with high frequency processing devices the likelihood of interference increases.

Not only do manufacturers of electronic devices strive to make products that will work reliably in places where EMI is present, but the amount of EMI emission is regulated by government bureaus such as the Federal Communications Commission (FCC). The FCC requires that electronic devices that might emit EMI must be certified to be below certain acceptable EMI levels.

EMI "shielding" is useful in both containing EMI in an electronic circuit, and preventing EMI from external sources from affecting the functioning of the circuit. An ideal shielding, or "shield," would be a smooth conducting surface forming a continuous and complete enclosure around the circuit, shaped and oriented according to the type of EMI to block and contain. However, such a design is not possible in the real world in real environments.

Prior art approaches have taken the approach of making the shielding part of the enclosure, or "chassis," of the housing of a device using an electronic circuit. In this approach, the design of the shielding suffers because a housing needs to perform additional functions such as mounting, protecting and supporting the components of the device. This requires that holes be made in the enclosure to allow, e.g., cables, controls, to enter and protrude from within the enclosure. Also, thermal considerations are a concern and the housing often needs to have ventilation holes. The size and shape of the housing often determines the major part of the size and shape of the overall device. An important design consideration is making the "footprint" of the device compatible with other devices or with the intended environment. A rectangular enclosure is often desirable so it can be stacked and easily moved and manipulated. However, the sharp corners of a rectangular design detract from an optimum shield. Also, the enclosure needs to be easily assembled and disassembled, first for the original manufacturing and later for servicing or upgrading. Achieving a rectangular design that is easily taken apart and put back together while at the same time provides high shielding has proven elusive.

Other considerations, such as keeping the cost of the housing low while maintaining structural integrity and maximizing the manufacturing yield of the housing, must be taken into account in the design.

Thus, it is desirable to provide a housing design providing EMI containment and shielding while, at the same time, meeting other design considerations such as ease of assembly and structural integrity.

SUMMARY OF THE INVENTION

The present invention is a metal enclosure formed of two or more basic parts. Each part is made of stamped sheet metal. The parts include a system of retention clips, spring fingers and embossed dimples to achieve easy assembly and a high level of EMI containment when the parts are assembled. The design also provides high structural rigidity and mechanical strength. In one embodiment, an enclosure providing a degree of electromagnetic shielding with respect to the interior of the enclosure is achieved. The enclosure includes: a first part formed of rigid flat conducting material bent to have one or more protruding tabs and at least one side; a second part formed of rigid flat conducting material having one or more clips to receive the one or more protruding tabs and one or more cuts in the second part forming one or more finger contact areas on the second part which are in tensioned contact with one or more areas on the at least one side of the first part.

BRIEF DESCRIPTION OF THE DRAWINGS

FIG. 7A shows tabulated data of EMI test results of a chassis design which does not use the integrated structures of the present invention;

FIG. 8A shows tabulated data of EMI test results of an enclosure according to the present invention;

DETAILED DESCRIPTION OF A PREFERRED EMBODIMENT

Figure 1:
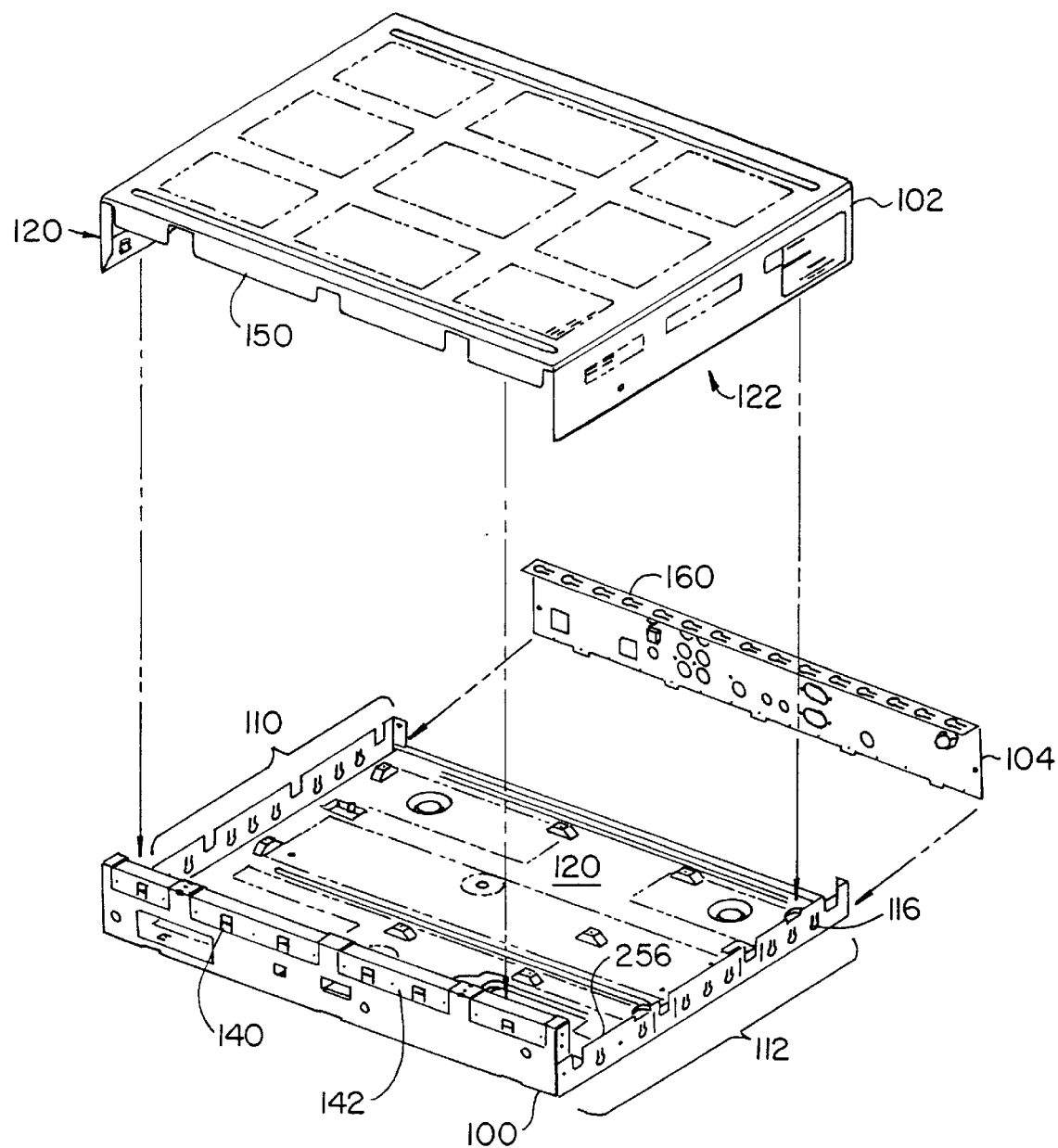
FIG. 1 shows parts used to form the enclosure of the present invention.

FIG. 1 shows a preferred embodiment using three basic parts to form the enclosure, or housing, of the present invention. As discussed below, the parts are formed of stamped conductive sheet metal and are assembled to form an enclosure that provides EMI shielding, structural integrity and simple and efficient assembly and disassembly.

In FIG. 1, bottom chassis 100 forms the base part of the enclosure. Top cover 102 mates to the top of bottom chassis 100. Rear panel 104 mates to the back of the enclosure so that the mating of all three parts creates a rectangular box housing for an electronic device. In the preferred embodiment, the enclosure is used to house General Instrument, Corporation's RDB-3 integrated receiver-decoder (IRD) circuit boards for the DSR-4XX product series of digital television satellite receivers. The first specific product is intended to be the DSR-430BNM. A full set of drawing specifications are provided with this application. The drawing specifications should be consulted for exact measurements and details of the preferred embodiment presented here.

FIG. 1 shows specific structures on each of the three parts that are used advantageously by the present invention. Bottom chassis 100 has sets of contact "fingers" along each of its sides 110 and 112. An exemplary finger 116 is shown. Although not all contact fingers are shown there are 8 on each of the sides 110 and 112. The contact finger design is such that each contact finger protrudes slightly from the planar surface of each of the sides 110 and 112. The direction of protrusion is outward, or away from, chassis interior 120. When top cover 102 is placed onto chassis bottom 100, the tolerance is such that the contact fingers on chassis side 110 contact top cover side 130 and the contact fingers on chassis side 112 contact top cover side 122. The modulus or stiffness of the metal material used to form the bottom chassis causes each contact finger to be in tensioned contact with the top cover. This provides good electrical contact so that the top and bottom parts form a good EMI shield.

In the preferred embodiment, hot-dipped galvanized cold-rolled steel is used to form the parts. Alternate materials may be used such as electro-galvanized cold-rolled steel. It is preferable to provide the metal with a highly conductive oxidation resistant surface finish. Any formable sheet of conductive material with sufficient stiffness can be used to practice the invention.

Bottom Chassis 100 also includes six "clips" such as clip 140 and ten "dimples" such as dimple 142 which are located to the left and to the right of each clip. These clips and dimples are arranged along the front part of bottom chassis 100. The clips are used to receive the tabs or "blades" such as blade 150 of top cover 102 in FIG. 1 while simultaneously forcing electrical contact between the blades and dimples for added EMI shielding and normal load distribution. The use of clips, blades and dimples in this manner provides secure fitting and retention of the top and bottom parts. Alternating clips with dimples provides more uniform force against the dimples for better contact. Clips are also present in top cover 102 while blades are also present in bottom chassis 100, as discussed below. Contact fingers, such as contact finger 160 are also present along the top lip of rear panel 104. This ensures good electrical contact between rear panel 104 and top cover 102. Electrical contact and fitting and retention between rear panel 104, top cover 102 and bottom chassis 100 are also provided by two screws, one at either side of rear panel 104. An additional single screw located near the top center of rear panel 104 is used to provide electrical contact and fitting and retention between the top cover 102 and rear panel 104.

Although the preferred embodiment uses three basic parts, it should be evident that the invention can be practiced with two or more parts forming an enclosure. For example, any two of the three parts shown in FIG. 1 can be combined or integrated. Back panel 104 can be formed from the same integral sheet as bottom chassis 100 or top cover 102. It should be evident that more than three parts can be used. For example, the front panel of bottom chassis 100 can be made into a separate part similar to back panel 104. In general, any number and arrangement of parts is possible and will provide the benefits of the present invention so long as the parts incorporate some of the specific structures discussed herein.

Details of the three parts of the preferred embodiment shown in FIG. 1 are next discussed.

Figure 2:
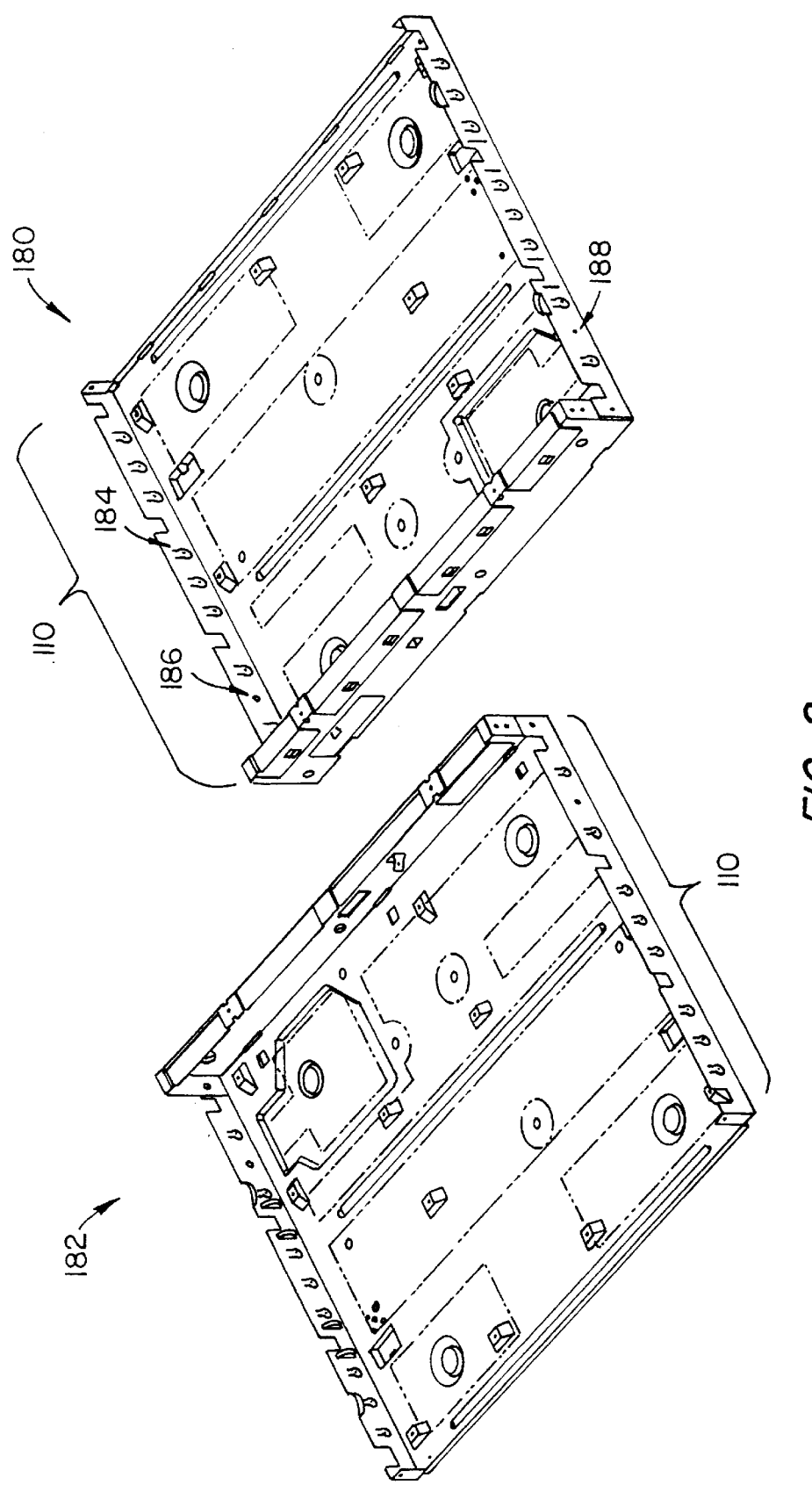
FIG. 2 is an enlarged view of the bottom chassis part of FIG. 1 shown in two orientations.

FIG. 2 is an enlarged view of the bottom chassis part of FIG. 1 shown in two orientations.

In FIG. 2, orientation 180 is the same as that shown in FIG. 1 for bottom chassis 100. Orientation 182 is rotated 180 degrees for a view from inside the enclosure to look at the rear of the front portion of bottom chassis 100. From these two views all of the contact finger positions, such as the finger at 184, can be seen clearly. There are 16 contact fingers in one bottom chassis part. Note that it is a design choice as to the exact number, dimensions, positioning and shape of the contact fingers. Since screw holes are placed at 186 and 188 there was no room, or need, to place a contact finger at these points.

Figure 3:
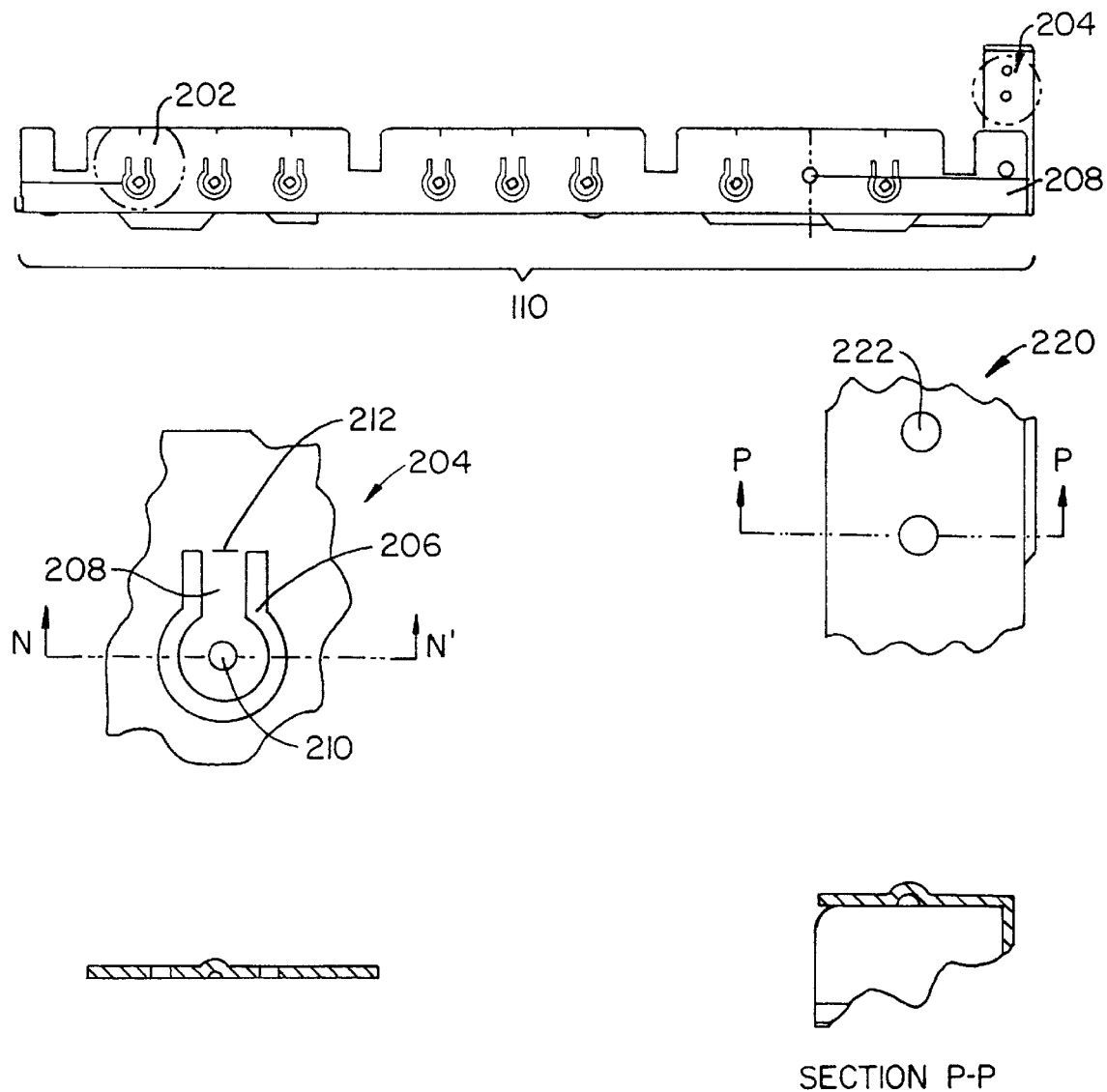
FIG. 3 shows expanded views of contact fingers.

FIG. 3 includes expanded views of details side 110 of the bottom chassis as shown in either of FIG. 1 or 2.

In FIG. 3, 204 is an expanded view of an exemplary contact finger such as contact finger 202. The design of each contact finger is an open circle cutout with a "bump" or protrusion in the center. Cutout 206 defines a contact finger area 208 within the cutout boundaries. Protrusion 210 is a raised bump in the center of the contact finger area. The diameter of the contact finger area at the diameter along the line N–N' is about 5 mm. The length of contact finger area from the line at 212 downwards to center 210 is about 12 mm. The protrusion is 0.5 to 0.8 mm high.

In the preferred embodiment, each contact finger area remains flush with the surface in which it was created except for the protrusion which extends from the surface. The close tolerances used in making the part dimensions ensure that there will be sufficient contact with the protrusions when parts are mated. The metal stiffness of the contact fingers causes enough pressure to maintain good electrical contact with a mated side. Alternatively, another technique can stress the contact finger areas to cause them to bend slightly in a desired direction for added contact force. For example, in FIG. 3, contact finger 204 can be bent anywhere on its contact finger area 208. A preferred point of bending can be at or near line 212. The bending need not occur at a specific point or line, but can be a deformation along the entire contact finger area 208. Any suitable shape can be used for the contact fingers and protrusions. Any number of protrusions at various extensions above the surface can be used. The protrusion need not be in the center of the contact finger area. There need not be any protrusion at all where the contact finger area is bent outward.

In FIG. 3, the area at 204 is shown in an expanded view at 220. The expanded view shows a protrusion at 222 that is not within a contact finger area. However, this protrusion is kept in contact with a part mated to side 110, such as side 120 of top cover 102 as discussed above in connection with FIG. 1. Specifically, the protrusion is kept in contact with the inner surface of top cover side 120 by the retention force exerted by the clip on the top cover that mates to the bottom chassis blade 208 (which is actually a part of side 110). Protrusion 222 projects about 0.8 mm–0.9 mm from the surface.

Figure 4:
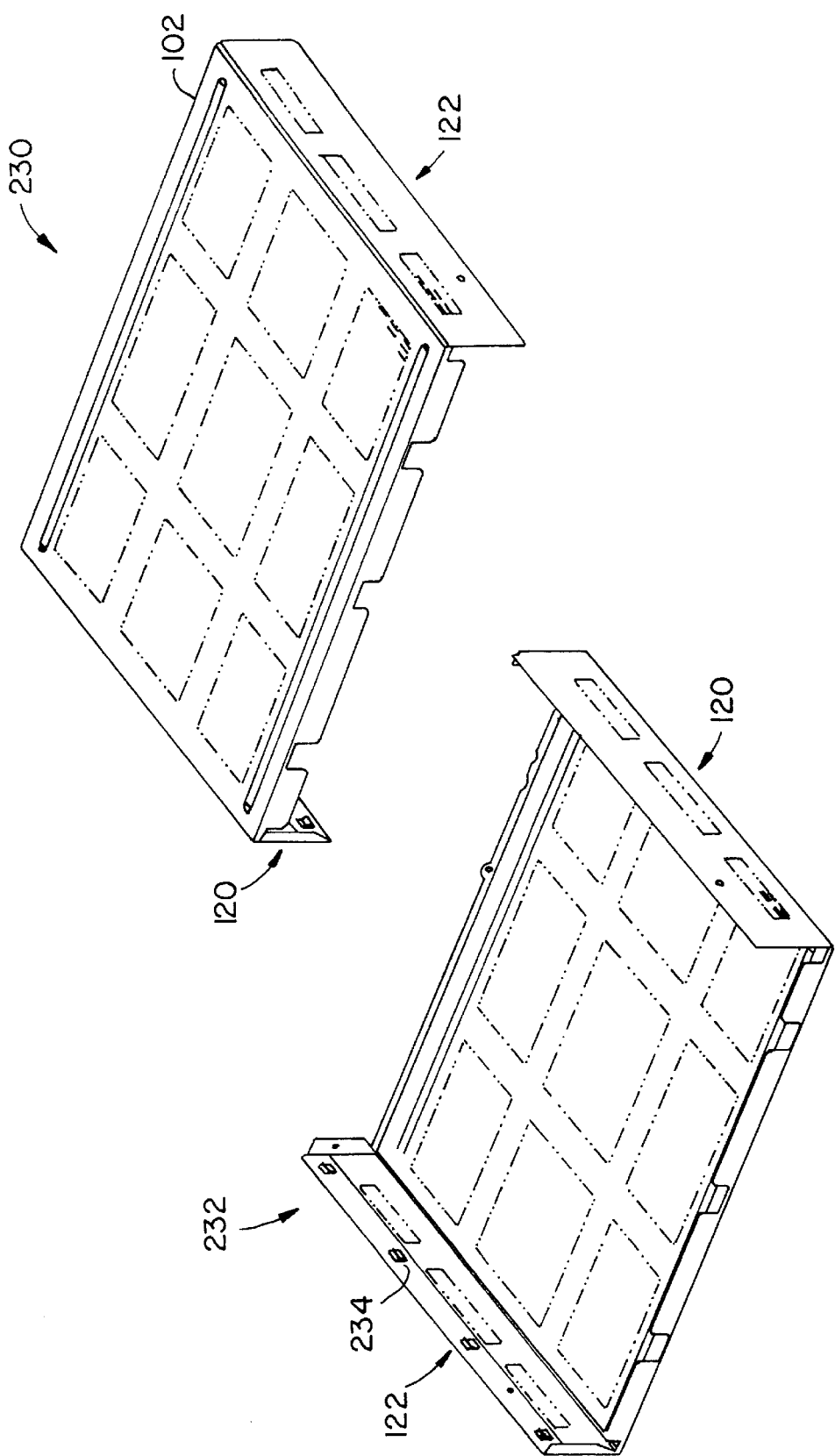
FIG. 4 shows the top cover part of FIG. 1 in two different orientations.

FIG. 4 shows top cover 102 of FIG. 1 in two different orientations. The orientation at 230 is the same as that shown in FIG. 1. The orientation at 232 is 180 degrees from that shown in FIG. 1. In the orientation at 232 the clips such as 234 are clearly shown on side 122. There are four clips on each side. Side 120's clips are not visible but are analogous to those shown for side 122.

Figure 5:
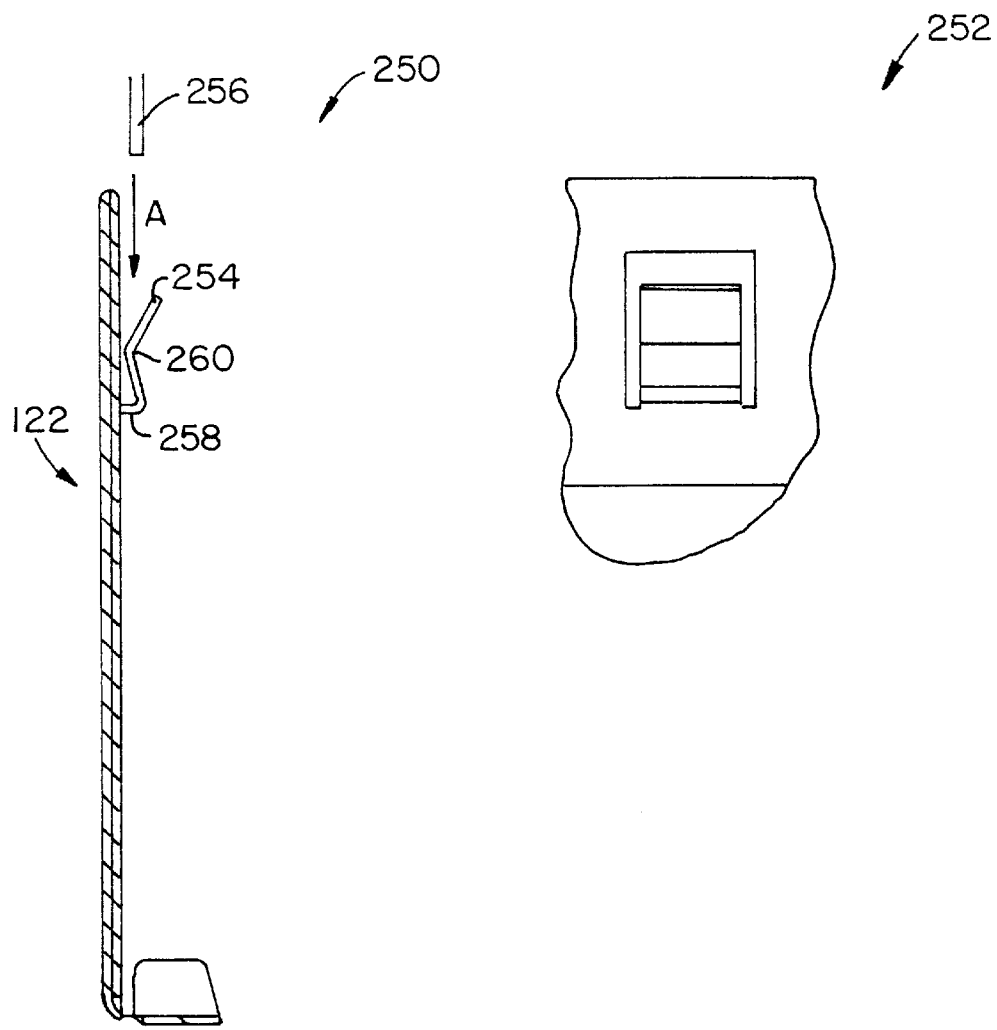
FIG. 5 shows two orthogonal expanded views of a clip.

FIG. 5 shows two orthogonal expanded views, 250 and 252, of a clip such as clip 234 of FIG. 4.

In FIG. 5, clip 254 is formed by punching and bending a portion of the same sheet metal used to form top cover 102.

Note that side 122 is formed of a doubled-over portion of sheet metal so that even though cutting and bending of the metal is necessary to form the clip, there is no resulting through-hole in side 122. Blade 256, as, for example, a blade structure on side 112 of bottom chassis 100 of FIG. 1, slides in the direction of arrow A to catch between clip 254 and side 122. The use of multiple blades and clips on each side in this manner provides more electrical contact and a securing of the two parts to each other. The blades are notched with notches closely matching the width of the clips for a more secure fit. Also, when the top cover is mated to the bottom chassis, the alternating arrangement of contact fingers and clips provides more uniform force between the sides of the top cover and the contact fingers on the bottom chassis. The height of a clip is about 7.5 mm. The spacing from the nearest clip point 260 to the side wall is 0.2–0.6 mm. The view at 252 shows the approximate width of the clip as 7.00 mm.

When blade 256 is mated to clip 254 the edge of blade 256 contacts clip bottom 258. This contact not only properly aligns and guides the mating but also provides structural support for the mated parts.

Figure 6:
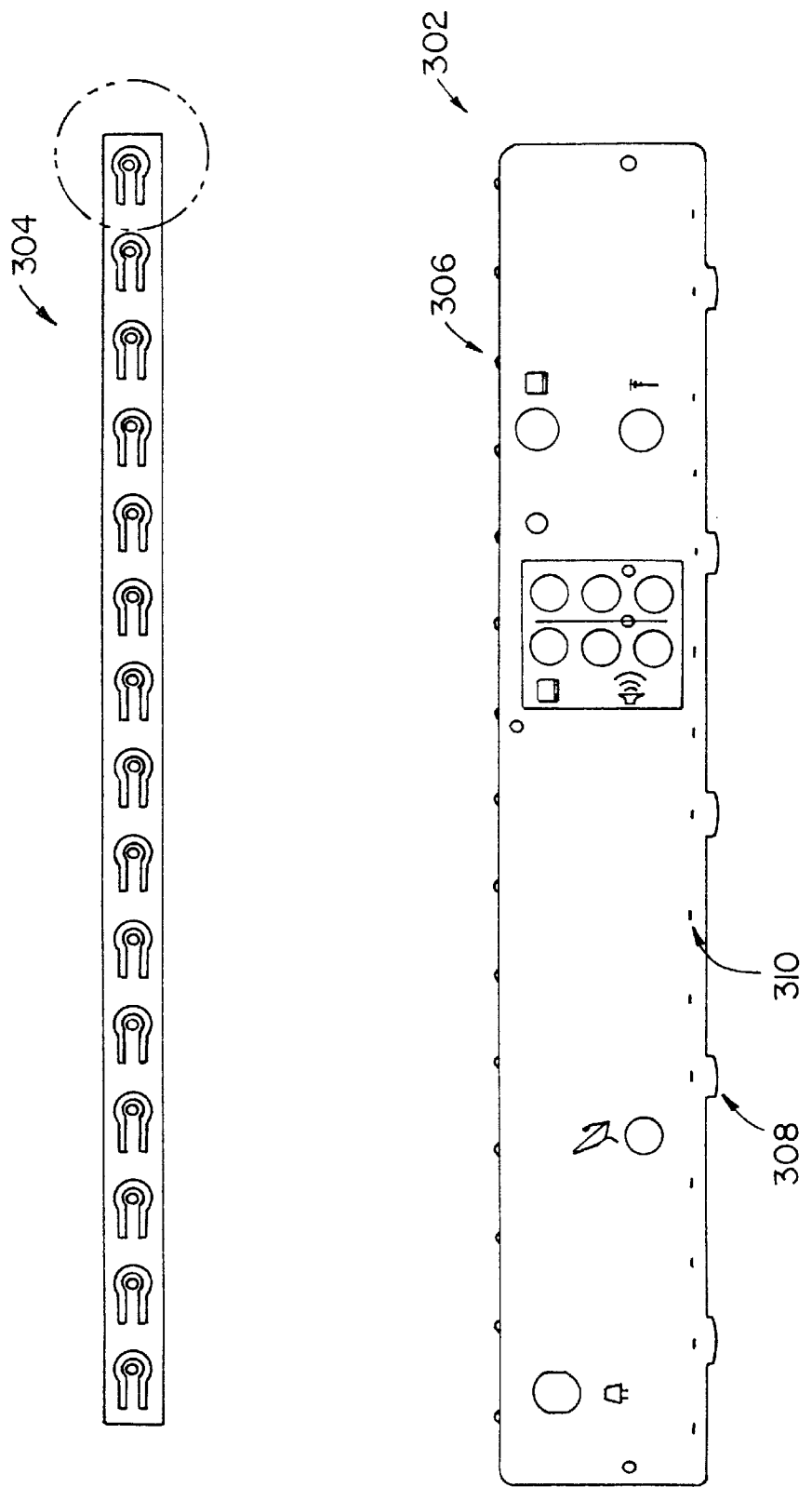
FIG. 6 shows two views of the back panel part of FIG. 1.

FIG. 6 shows two views of back panel 104 of FIG. 1. The side of the back panel external to the inside of the enclosure is shown at 302. A top edge view of the back panel is shown at 304. Note the top edge view shows 15 contact fingers similar to the contact fingers discussed above. Protrusions of the contact fingers, such as at 306, are shown in the back panel external view at 302. Tabs such as tab 308 are along the bottom of the back panel as are dimples 310. The tabs provide a visual alignment cue for ease of assembly. Also, the tabs themselves have dimples, such as 312, for contact with the "lip" on the rear portion of bottom chassis 100. Furthermore, the tabs ensure proper positioning of the rear panel so all dimples along the bottom edge contact the chassis "lip."

A separate back panel part design was chosen so that the chassis bottom and top cover can be used in several product models that require different cutouts in the back panel. Since the back panel is a relatively flat and small part, it is more efficient to store multiple types of back panels which can then be used to construct the different product model enclosure, as needed.

Considerable cost of manufacturing savings are achieved with the present invention by integrating the clips into the parts of the enclosure, itself, without requiring separate structures. The structural rigidity and strength of the enclosure is improved due to the ability of the clips to distribute applied loads, thereby allowing the use of thinner sheet metal to reduce cost and weight. Although the invention has been described as an enclosure for a specific device, or product, the enclosure can be adapted for different uses. For example, the enclosure can be made smaller to shield a subset of components within a device.

Figure 7B:
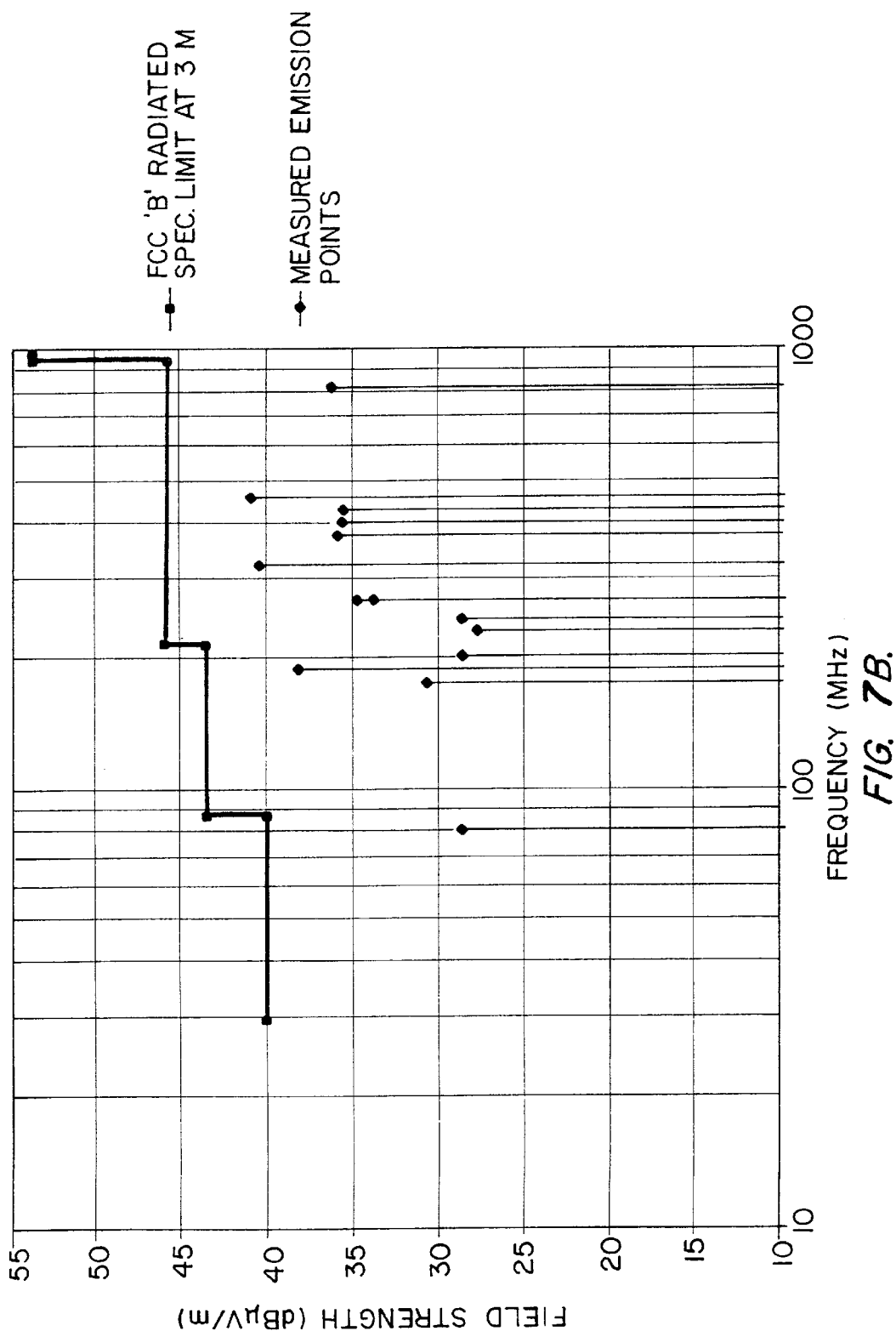
FIG. 7B is a plot of EMI test results of a chassis design which does not have the integrated structures of the present invention.

FIGS. 7A and 7B show EMI test results of a chassis design which does not have any of the integrated structures as discussed above. Instead, the design used additional parts such as a ferrite, screws, metal shields, filtering capacitors, etc., as well as a circuit board redesign to achieve a minimally acceptable margin of −4.9 dB.

Figure 8B:
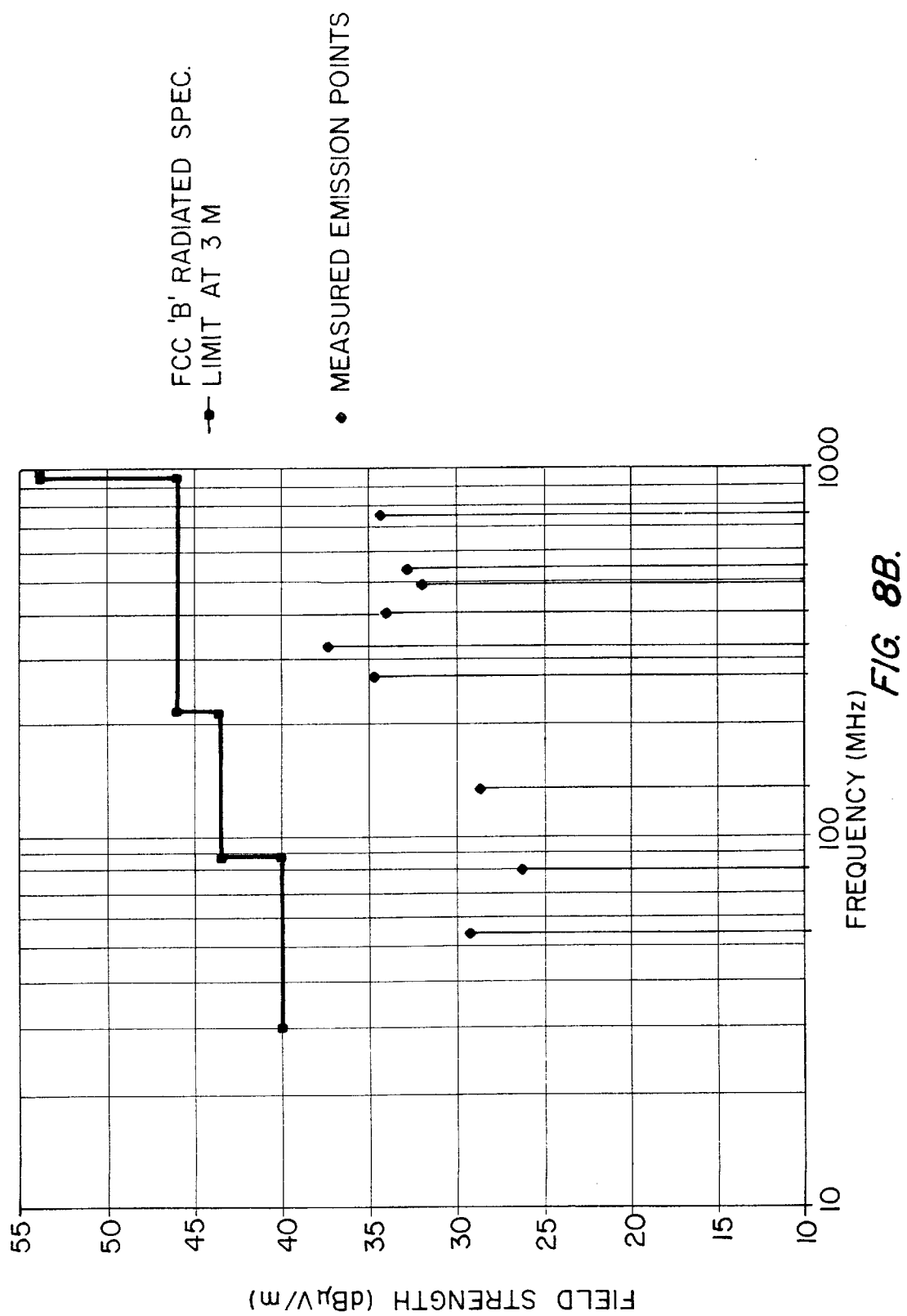
FIG. 8B shows a plot of EMI test results of an enclosure according to the present invention.

FIGS. 8A and 8B show EMI test results of an enclosure built according to the present invention, as discussed above. A circuit board within the enclosure did not use a ferrite, metal shield or additional screws (other than shown for the design of the preferred embodiment). A margin of −8.6 dB was achieved.

The test results show that use of the design according to the present invention using clips, contact fingers and protrusions integrated with a 3-part enclosure assembly is a superior design. Also, the ability to achieve EMI shielding with fewer components reduces cost and complexity and has concomitant manufacturing, performance and sales benefits.

Thus the invention has been disclosed with respect to specific preferred embodiments thereof. Specifically, preferred designs of numbers and placements of clips, tabs, blades and contact fingers on an IRD chassis' component parts are discussed above. One of skill in the art will appreciate that many small changes and design choices relevant to the type of electronic enclosure being constructed may be realized using the present invention. Note that the discussion of preferred embodiments is illustrative and not restrictive of the invention, the scope of which is to be determined solely by the appended claims.

What is claimed is:

1. An enclosure providing electromagnetic interference shielding, the enclosure comprising:

a first part formed of a first sheet of stiff conducting material and having a side;

a second part mated with the first part, wherein the second part is formed of a second sheet of stiff conducting material including a doubled over portion forming first and second adjacent layers of said material of the second sheet; and at least one clip configured to receive the side of the first part, wherein said at least one clip is formed from the first adjacent layer by cutting and bending a portion of the first adjacent layer.

2. The enclosure of claim 1, further comprising at least one cutout in at least one of said parts forming at least one contact finger in tensioned contact with one area on the other of said parts when the first and second parts are mated together.

3. The enclosure of claim 2, further comprising a protrusion on said at least one contact finger area.

4. The enclosure of claim 3, further comprising a linear arrangement of clips and contact fingers when the first and second parts are mated.

5. The enclosure of claim 1, wherein the first part is slidably coupled to the second part.

6. A method of providing an electromagnetic interference shielded enclosure, the method comprising the steps of:

forming a first part from a sheet of stiff conductive material;

forming a second part from a sheet of stiff conductive material;

forming at least one clip into the second part, wherein said at least one clip is formed by doubling over a portion of the second part to form first and second adjacent layers of said material and by cutting and bending a portion of the first adjacent layer; and mating the first and second parts by receiving a side of the first part in said at least one clip on the second part.

7. The method of claim 6, further comprising the step of forming at least one contact finger on one of the parts so that the contact finger are in tensioned contact with the other part when the parts are mated.

8. The method of claim 6, wherein the step of mating the first and second parts further comprises the substep of sliding a portion of the first part into said at least one the clip of the second part.

\* \* \* \* \*